(12) United States Patent
Chandra

(10) Patent No.: US 11,672,077 B2
(45) Date of Patent: Jun. 6, 2023

(54) ZONED DIELECTRIC LOSS CIRCUIT BOARD SYSTEM

(71) Applicant: Dell Products L.P., Round Rock, TX (US)

(72) Inventor: Umesh Chandra, Santa Cruz, CA (US)

(73) Assignee: Dell Products L.P., Round Rock, TX (US)

( * ) Notice: Subject to any disclaimer, the term of this patent is extended or adjusted under 35 U.S.C. 154(b) by 177 days.

(21) Appl. No.: 17/158,524

(22) Filed: Jan. 26, 2021

(65) Prior Publication Data
US 2022/0240366 A1  Jul. 28, 2022

(51) Int. Cl.
*H03H 7/38* (2006.01)
*H05K 1/02* (2006.01)

(52) U.S. Cl.
CPC .......... *H05K 1/024* (2013.01); *H05K 1/0245* (2013.01)

(58) Field of Classification Search
CPC ........... H05K 1/024; H05K 1/025; H03H 7/38
USPC ............................................. 333/34
See application file for complete search history.

(56) References Cited

U.S. PATENT DOCUMENTS

2004/0000963 A1 * 1/2004 Killen ................. H01P 5/02
333/35

\* cited by examiner

*Primary Examiner* — Stephen E. Jones
(74) *Attorney, Agent, or Firm* — Joseph Mencher

(57) ABSTRACT

A zoned dielectric loss circuit board system includes a board. A first differential trace is included in the board. A dielectric layer is included the board and that includes a first dielectric layer zone that engages the first differential trace and that includes first dielectric loss characteristics, and a second dielectric layer zone that is located immediately adjacent the first dielectric layer zone and that includes second dielectric loss characteristics that are greater than the first dielectric loss characteristics. A second differential trace may be included in the board in engagement with the second dielectric layer zone, and may have a second trace length that is shorter than a first trace length of the first differential trace.

20 Claims, 9 Drawing Sheets

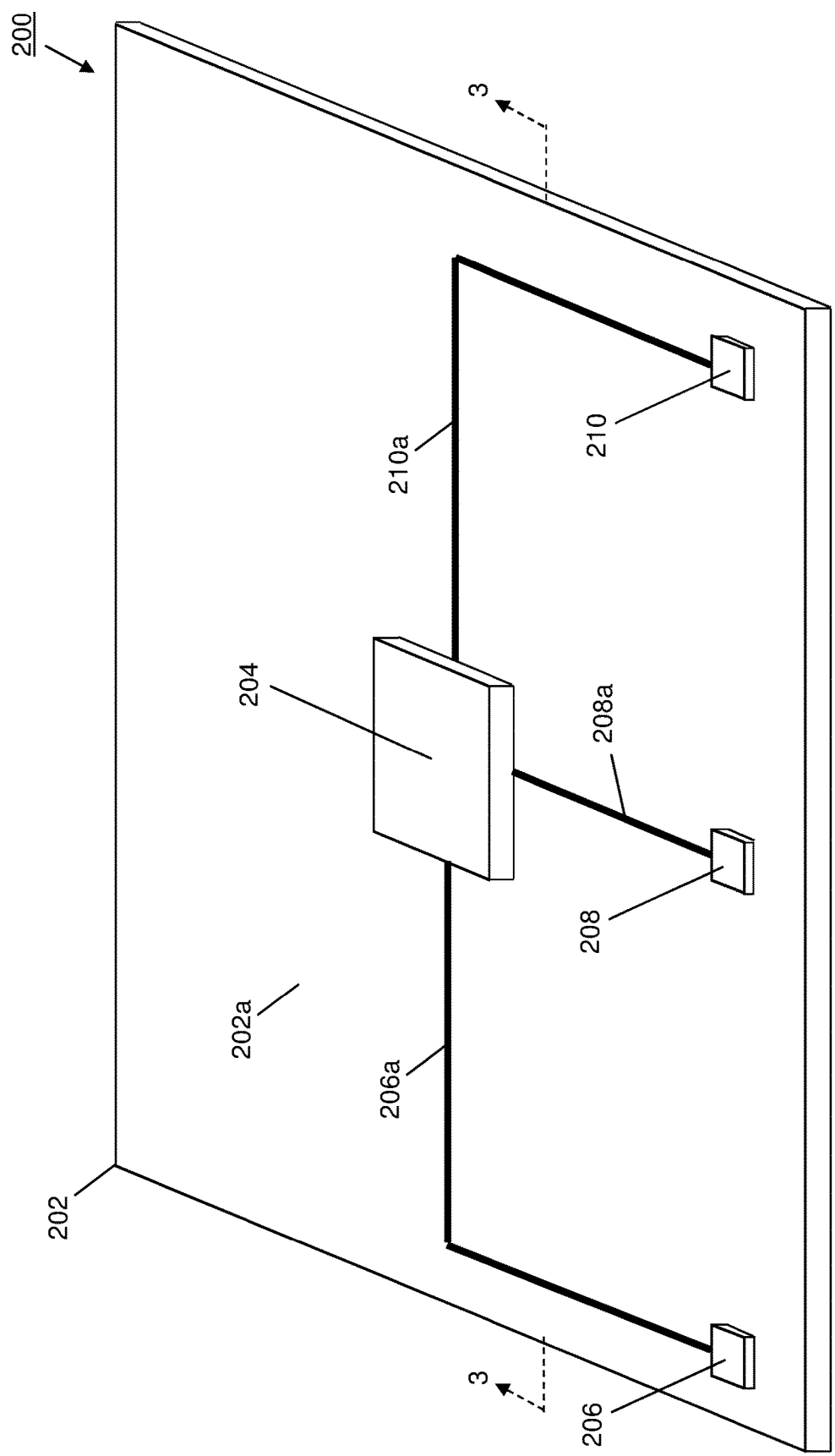

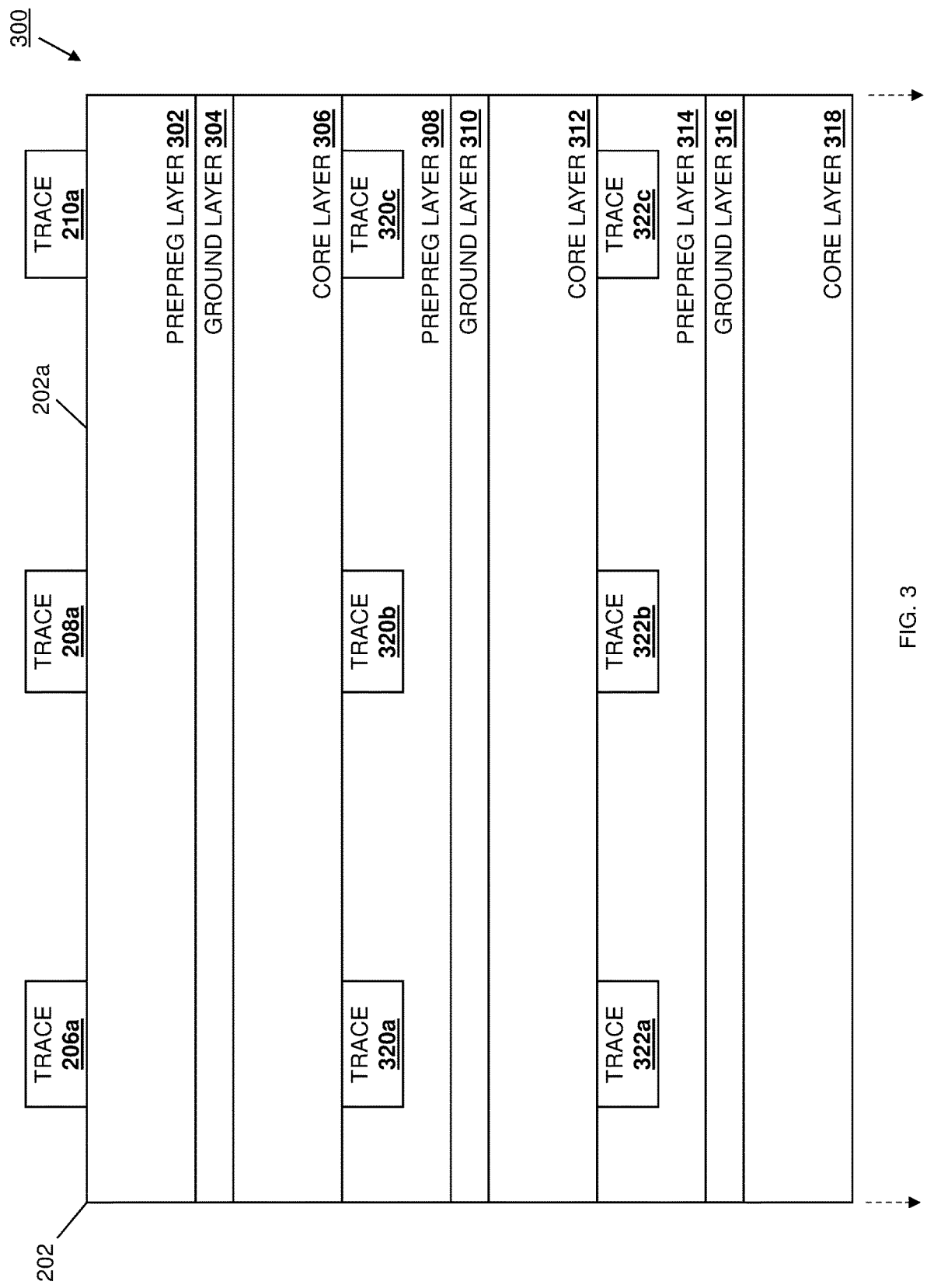

ZONED DIELECTRIC LOSS CIRCUIT BOARD SYSTEM

BACKGROUND

The present disclosure relates generally to information handling systems, and more particularly to zoned dielectric loss circuit boards for use in information handling systems.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems such as, for example, server devices, networking devices (e.g., switch devices), storage systems, desktop computing devices, laptop computing devices, tablet computing devices, mobile phones, and/or other computing devices known in the art, often utilize circuit boards upon which computing device components are mounted and communicatively coupled together via traces included within and/or on that circuit board. Circuit boards utilized in computing devices often include a surface portion having a surface portion dielectric medium provided by a prepreg layer, with differential traces (called "microstrip traces") positioned on that surface portion dielectric medium, as well as a plurality of internal portions each having an internal portion dielectric medium made up of a core layer and a prepreg layer, with that internal portion dielectric medium positioned between ground layers (e.g., copper layers) and including differential traces (called "stripline traces") suspended in that internal portion dielectric medium.

Furthermore, for any differential trace that will transmit relatively high-speed signals (e.g., differential traces that transmit differential signals such as Non-Return to Zero (NRZ) signals transmitted at frequencies of 28 Gbps or higher, Pulse Amplitude Modulation 4-level (PAM4) signals transmitted at frequencies of 56 Gbps or higher, etc.) over a threshold distance, the dielectric medium in or on which that differential trace is located may be required to have relatively low dielectric loss characteristics (e.g., a relatively low dielectric constant (DK), a relatively low dissipation factor (DF), etc.) in order to ensure that the signal integrity of signals transmitted on that differential trace meet a signal integrity threshold (e.g., insertion losses for signals transmitted on that differential trace must not exceed a maximum insertion loss as specified by industry standards such as the Institute of Electrical and Electronics Engineers (IEEE) 802 family of standards). As such, in circuit boards with high speed differential traces, the prepreg layer upon which those high-speed differential traces are positioned, or the core layer and prepreg layer within which those high-speed differential traces are provided, must have relatively low dielectric loss characteristics, increasing the costs of those circuit boards due to the relatively high costs of those low-dielectric-loss-characteristic core layers and prepreg layers.

Accordingly, it would be desirable to provide a circuit board system that addresses the issues discussed above.

SUMMARY

According to one embodiment, an Information Handling System (IHS) includes a circuit board; a processing system that is mounted to the circuit board; a first differential trace that is included in the circuit board and that extends from the processing system; and a dielectric layer that is included the circuit board and that includes: a first dielectric layer zone that engages the first differential trace and that includes first dielectric loss characteristics; and a second dielectric layer zone that is located immediately adjacent the first dielectric layer zone and that includes second dielectric loss characteristics that are greater than the first dielectric loss characteristics.

BRIEF DESCRIPTION OF THE DRAWINGS

FIG. 2 is a top perspective view illustrating an embodiment of a circuit board.

FIG. 3 is a cross-sectional view illustrating an embodiment of the circuit board of FIG. 2.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
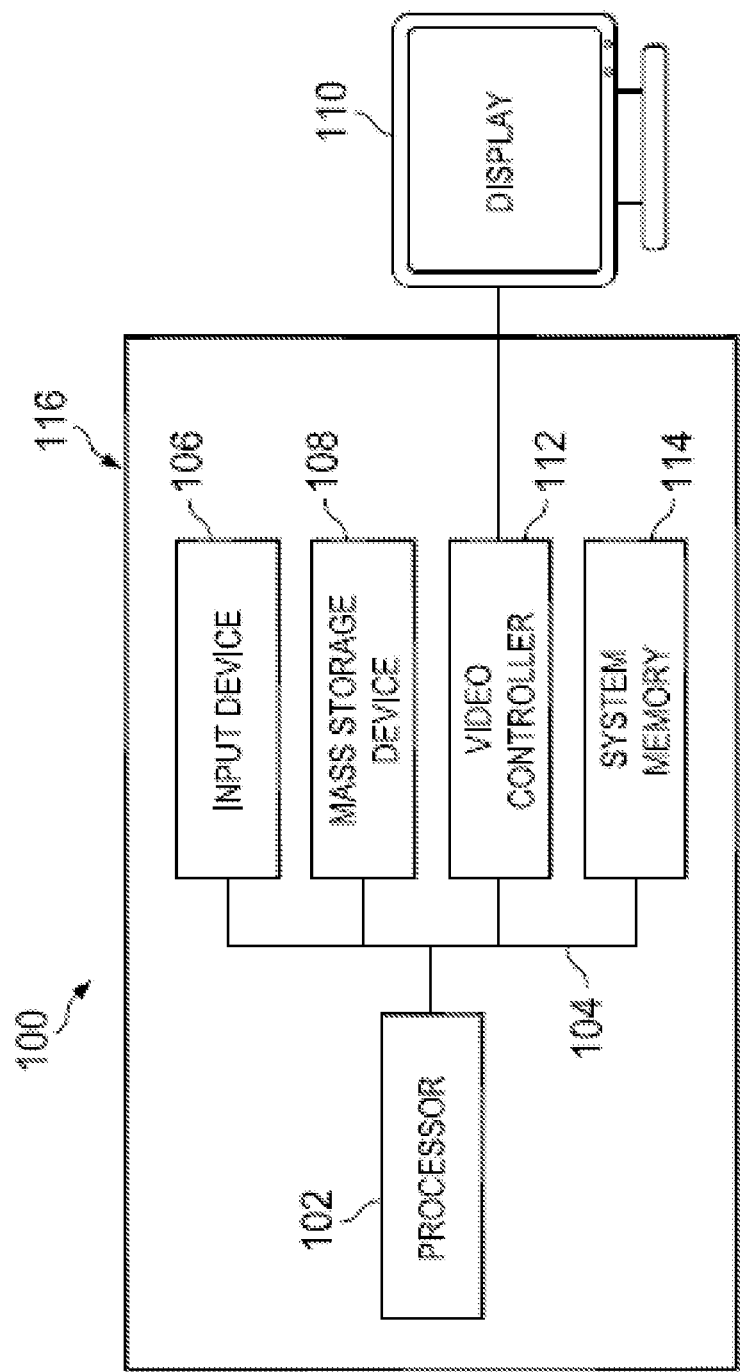
FIG. 1 is a schematic view illustrating an embodiment of an Information Handling System (IHS).

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety of other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Referring now to FIG. 2, an embodiment of a circuit board 200 is illustrated. In the discussion below, the circuit board 200 is described as being configured conventionally as well as being configured with the zoned dielectric loss circuit board system of the present disclosure in order to demonstrate the differences between the teachings of the present disclosure and the prior art, and thus the reference numbers for features that are common across the conventionally configured circuit board 200 and the circuit board 200 configured with the zoned dielectric loss circuit board system of the present disclosure will remain constant across both discussions. In the illustrated embodiment, the circuit board 200 may be provided in the IHS 100 discussed above with reference to FIG. 1, may include and/or be coupled to some or all of the components of the IHS 100, and in the specific examples below is described as being provided in a networking device such as a switch device.

However, while illustrated and discussed as being provided in a networking device such as a switch device, one of skill in the art in possession of the present disclosure will appreciate that the circuit board 200 may be provided in server devices, storage systems, desktop computing devices, laptop computing devices, tablet computing devices, mobile phones, and/or any other device or subsystem and configured to operate similarly as discussed below. As will be appreciated by one of skill in the art in possession of the present disclosure, FIG. 2 illustrates an external portion of the circuit board 200. For example, the circuit board 200 may include a base 202 including an external surface 202*a* and, as described in further detail below, the base 202 may include a plurality of layers (e.g., below its external surface 202*a*) that provide a plurality of internal portions of the circuit board 200.

In the illustrated embodiment, a processing system 204 is mounted to the external surface 202*a* of the base 202, and in the specific examples below may be provided by a Network Processing Unit (NPU) in a switch device or other networking device that would be apparent to one of skill in the art in possession of the present disclosure. However, one of skill in the art in possession of the present disclosure will appreciate that the processing system 204 may be provided by other processing devices (e.g., Central Processing Units (CPUs)) and/or replaced by other computing components (e.g., memory devices, etc.) while remaining within the scope of the present disclosure as well. Furthermore, in the illustrated embodiment a plurality of connectors 206, 208, and 210 are mounted to the external surface 202*a* of the base 202, and in the specific examples below may be provided by Input/Output (I/O) connectors such as Quad Small Form factor Pluggable Double Density (QSFP-DD) connectors that are accessible on an external surface/front panel of a switch device, although one of skill in the art in possession of the present disclosure will appreciate that the connectors 206, 208, and 210 may be provided by other connectors, or replaced with other computing components while remaining within the scope of the present disclosure as well.

In the illustrated embodiment, a differential bus provide by differential trace 206*a* (e.g., a pair of traces) extends between the processing system 204 and the connector 206 on the external surface 202*a* of the base 202, a differential bus provide by differential trace 208*a* (e.g., a pair of traces) extends between the processing system 204 and the connector 208 on the external surface 202*a* of the base 202, a differential bus provide by differential trace 210*a* (e.g., a pair of traces) extends between the processing system 204 and the connector 208 on the external surface 202*a* of the base 202, and one of skill in the art in possession of the present disclosure will recognize that the differential traces 206*a*, 208*a*, and 210*a* provided on the external surface 202*a* of the base 202 are referred to as "microstrip traces" due to their being located on the external surface 202 of the base 202. In some embodiments described below, the base 202 of the circuit board 200 may substantially extend across the width of the chassis (e.g., the chassis 116 discussed above with reference to FIG. 1) of the networking/switch device in which it is located, with the connector 206 positioned adjacent a first edge of that chassis (and the differential trace 206*a* extending across the base 202/circuit board 200 from the processing system 204 to that connector 206), the connector 208 positioned substantially centrally on that chassis, and the connector 210 positioned adjacent a second edge of that chassis that is opposite the first edge (and the differential trace 210*a* extending across the base 202/circuit board 200 from the processing system 204 to that connector 210). However, while a specific circuit board 200 has been illustrated and described, one of skill in the art in possession of the present disclosure will recognize that the circuit boards utilizing the zoned dielectric loss circuit board system of the present disclosure may include a variety of components and component configurations while remaining within the scope of the present disclosure as well.

Referring now to FIG. 3, an embodiment of a circuit board 300 is illustrated that includes features of the circuit board 200 discussed above with reference to FIG. 2 (e.g., the circuit board 300 of FIG. 3 provides a cross-section of the circuit board 200 of FIG. 2 taken along line 3-3), and thus features common between the circuit boards 200 and 300 are provided with the same reference numbers. In the discussion below, the circuit board 300 is described as being configured conventionally as well as being configured with the zoned dielectric loss circuit board system of the present disclosure in order to demonstrate the differences between the teachings of the present disclosure and the prior art, and thus the element numbers for features that are common across the conventionally configured circuit board 300 and the circuit board 300 configured with the zoned dielectric loss circuit board system of the present disclosure will remain constant across both discussions.

In the illustrated embodiment, the circuit board 300 may be provided in the IHS 100 discussed above with reference to FIG. 1, may include and/or be coupled to some or all of the components of the IHS 100, and in the specific examples below is described as being provided in a networking device such as a switch device. However, while illustrated and discussed as being provided in a networking device such as a switch device, one of skill in the art in possession of the present disclosure will appreciate that the circuit board 300 may be provided in server devices, storage systems, desktop computing devices, laptop computing devices, tablet computing devices, mobile phones, and/or any other device or subsystem and configured to operate similarly as discussed below. As will be appreciated by one of skill in the art in possession of the present disclosure, the circuit board 300 in the example provided in FIG. 3 illustrates internal portions of the circuit board 200. As such, the circuit board 300 may include the base 202 of the circuit board 200 including the external surface 202a.

In the illustrated embodiment, the circuit board 300 includes a prepreg layer 302 that provides and/or is located immediately adjacent the external surface 202a of the base 200 (e.g., the external surface 202a of the base 200 may include a protective layer provided on the prepreg layer 302), a ground layer 304 located immediately adjacent the prepreg layer 302, a core layer 306 layer located immediately adjacent the ground layer 304, a prepreg layer 308 located immediately adjacent the core layer 306, a ground layer 310 located immediately adjacent the prepreg layer 308, a core layer 312 layer located immediately adjacent the ground layer 310, a prepreg layer 314 located immediately adjacent the core layer 312, a ground layer 316 located immediately adjacent the prepreg layer 314, a core layer 318 layer located immediately adjacent the ground layer 316, and one of skill in the art in possession of the present disclosure will appreciate how the ground/prepreg/core/ground layer sections of the circuit board 300 illustrated in FIG. 3 may repeat across the thickness (e.g., between the external surface 202a and an opposing external surface) of the circuit board 300.

FIG. 3 illustrates how the differential traces 206a, 208a, and 210a discussed above with reference to FIG. 2 may be provided immediately adjacent the prepreg layer 302 (e.g., as "microstrip traces" positioned on the external surface 202a of the base 202). Furthermore, immediately adjacent core/prepreg layers internal to the base 202 may provide respective dielectric layers in a dielectric medium that includes differential traces suspended therein (e.g., "stripline" traces positioned internally on the base 202), and FIG. 3 illustrates how differential traces 320a, 320b, and 320c may be suspending in a dielectric medium provided by the core layers 306 and the prepreg layer 308; and differential traces 322a, 322b, and 322c may be suspending in a dielectric medium provided by the core layers 312 and the prepreg layer 314. While not explicitly illustrated in FIG. 3, one of skill in the art in possession of the present disclosure will appreciate how the differential traces 320a and 322a may include routing similar to the differential trace 206a illustrated in FIG. 2 (e.g., between the processing system 204 and the connector 206) and thus may include a trace length that is similar to the differential trace 206a illustrated in FIG. 2, the differential traces 320b and 322b may include routing similar to the differential trace 208a illustrated in FIG. 2 (e.g., between the processing system 204 and the connector 208) and thus may include a trace length that is similar to the differential trace 208a illustrated in FIG. 2, and the differential traces 320c and 322c may include routing similar to the differential trace 210a illustrated in FIG. 2 (e.g., between the processing system 204 and the connector 210) and thus may include a trace length that is similar to the differential trace 210a illustrated in FIG. 2

In a specific example, the circuit board 300 may be manufactured using Copper Clad Layers (CCL) that each initially include a core layer sandwiched between copper layers. As such, a first CCL may be provided that includes the ground layer 316 (e.g., a copper layer), the core layer 318, and another ground layer (not illustrated, but provided by a copper layer located opposite the core layer 318 from the ground layer 316). The prepreg layer 314 may then be provided on the ground layer 316. A second CCL may then have one of its copper layers etched to provide the differential traces 322a-322c, and that second CCL may then be positioned on the prepreg layer 314 such that the differential traces 322a-322c engage the prepreg layer 314, the core layer 312 on that second CCL is located immediately adjacent the differential traces 322a-322c and the prepreg layer 314, and the ground layer 310 (e.g., a copper layer) on that second CCL is located immediately adjacent the core layer 312.

The prepreg layer 308 may then be provided on the ground layer 310. A third CCL may then have one of its copper layers etched to provide the differential traces 320a-320c, and that third CCL may then be positioned on the prepreg layer 308 such that the differential traces 320a-320c engage the prepreg layer 308, the core layer 306 on that third CCL is located immediately adjacent the differential traces 320a-320c and the prepreg layer 308, and the ground layer 304 (e.g., a copper layer) on that third CCL is located immediately adjacent the core layer 306. Finally, the prepreg layer 302 may then be provided on the ground layer 304, and a copper layer may be provided on the prepreg layer 302 and then etched to provide the differential traces 206a, 208a, and 210a. However, while a specific example of a circuit board 300 and a specific discussion of the manufacturing techniques used to provide that circuit board are provided, one of skill in the art in possession of the present disclosure will appreciate that circuit boards with different configurations and provided using different manufacturing techniques will fall within the scope of the present disclosure as well. For example, while not illustrated in FIG. 3, one of skill in the art in possession of the present disclosure will appreciate that one or more internal portions of the circuit board 300 may include a dielectric medium provided between ground and/or power layers and without any differential traces suspended therein (with that dielectric medium provided by the "standard-loss" dielectric materials discussed below).

As discussed above, for any differential trace in the circuit board 200/300 that will transmit relatively high-speed signals (e.g., differential traces that transmit differential signals such as NRZ signals transmitted at frequencies of 28 Gbps or higher, PAM4 signals transmitted at frequencies of 56 Gbps or higher, etc.) over a threshold distance, the dielectric medium in or on which that differential trace is located may be required to have relatively low dielectric loss characteristics (e.g., a relatively low dielectric constant (DK), a relatively low dissipation factor (DF), etc.) in order to ensure that the signal integrity of signals transmitted on that differential trace meet a signal integrity threshold (e.g., insertion losses for signals transmitted on that differential trace must not exceed a maximum insertion loss as specified by industry standards such as the Institute of Electrical and Electronics Engineers (IEEE) 802 family of standards).

When the circuit board 200/300 is provided with a conventional configuration and the differential traces 206a, 208a, 210a, 320a-320c, and 322a-322c will transmit relatively high-speed signals, the prepreg layer 302 that provides the dielectric medium immediately adjacent the differential traces 206a, 208a, and 210a, the core layer 306 and prepreg layer 308 that provide the dielectric medium immediately adjacent the differential traces 320a-320c, and the core layer 312 and prepreg layer 314 that provides the dielectric medium immediately adjacent the differential traces 322a-322c, will all be provided with relatively low dielectric loss characteristics, increasing the costs of the circuit board 200/300 due to the relatively high costs of those low-dielectric-loss-characteristic core layers and prepreg layers. For example, for the NRZ signals transmitted at frequencies of 28 Gbps or higher or the PAM4 signals transmitted at frequencies of 56 Gbps or higher discussed above, dielectric materials used for the prepreg layer 302, the core layer 306, the prepreg layer 308, the core layer 312, and the prepreg layer 314 in the circuit board 200/300 will be "ultra-low-loss" dielectric materials with dielectric loss characteristics (e.g., DK, DF, etc.) that are below a dielectric loss characteristics threshold (e.g., a DK below 3, a DF below 0.008, etc.) One of skill in the art in possession of the present disclosure will recognize how such "ultra-low-loss" dielectric materials are relatively more expensive than "low-loss" dielectric materials (e.g., with a DK between 3 and 4, a DF between 0.008 to 0.02, etc.) and "standard-loss" dielectric materials (e.g., with a DK of 4 or greater, a DF of 0.002 or greater, etc.) However, while specific DK and DF values are provided above to provide an example of relative different between different dielectric materials, one of skill in the art in possession of the present disclosure will appreciate that other DK and DF values may fall within the scope of the present disclosure as well.

The inventor of the present disclosure has discovered that the relatively low dielectric loss characteristics of the dielectric medium immediately adjacent differential traces in a circuit board are only required for differential traces that exceed a trace-length threshold, and thus has developed the zoned dielectric loss circuit board system of the present disclosure in order to take advantage of that discovery and reduce the costs associated with the utilization of "ultra-low-loss" dielectric materials in circuit boards. For example, with reference to the circuit boards 200 and 300 discussed above with reference to FIGS. 2 and 3, the differential traces 206a, 320a, and 322a that are routed between the processing system 204 and the connector 206, and the differential traces 210a, 320c, and 322c that are routed between the processing system 204 and the connector 210, may all include a trace length that exceeds a trace length threshold, while the differential traces 208a, 320b, and 322c that are routed between the processing system 204 and the connector 208 may all include a trace length that does not exceed the trace length threshold.

As discussed above, the use of relatively low dielectric loss characteristic materials for the dielectric medium immediately adjacent a high-speed differential trace ensures that the signal integrity of signals transmitted on that differential trace meets a signal integrity threshold. However, differential traces below the trace length threshold will not experience insertion losses for signals transmitted on that differential trace that exceed a maximum insertion loss, and thus do not require the relatively low dielectric loss characteristic materials for their immediately adjacent dielectric medium. As such, continuing with the example above, while the differential traces 206a/320a/322a and 210a/320c/322c exceed the trace length threshold and thus require the relatively low dielectric loss characteristic materials for their immediately adjacent dielectric medium, the differential traces 208a/320b/322b do not exceed the trace length threshold and thus do not require the relatively low dielectric loss characteristic materials for their immediately adjacent dielectric medium. Thus, the zoned dielectric loss circuit board system of the present disclosure provides different zones in a dielectric layer that include different dielectric loss characteristics, which allows the relatively lower cost dielectric materials to be provided immediately adjacent differential traces that do not exceed the trace length threshold (or in areas of the circuit board where no immediately adjacent traces are provided), while providing the relatively higher cost dielectric materials immediately adjacent differential traces that exceed the trace length threshold. As will be appreciated by one of skill in the art in possession of the present disclosure, the trace length threshold discussed herein may vary depending on different circuit board and signal transmission factors, and thus different trace length thresholds will fall within the scope of the present disclosure. To provide a specific example, differential traces that are longer than 9 inches and that transmit 56 Gbps PAM4 signals will typically require the "ultra-low-loss" dielectric materials/dielectric mediums discussed above.

Figure 4A:
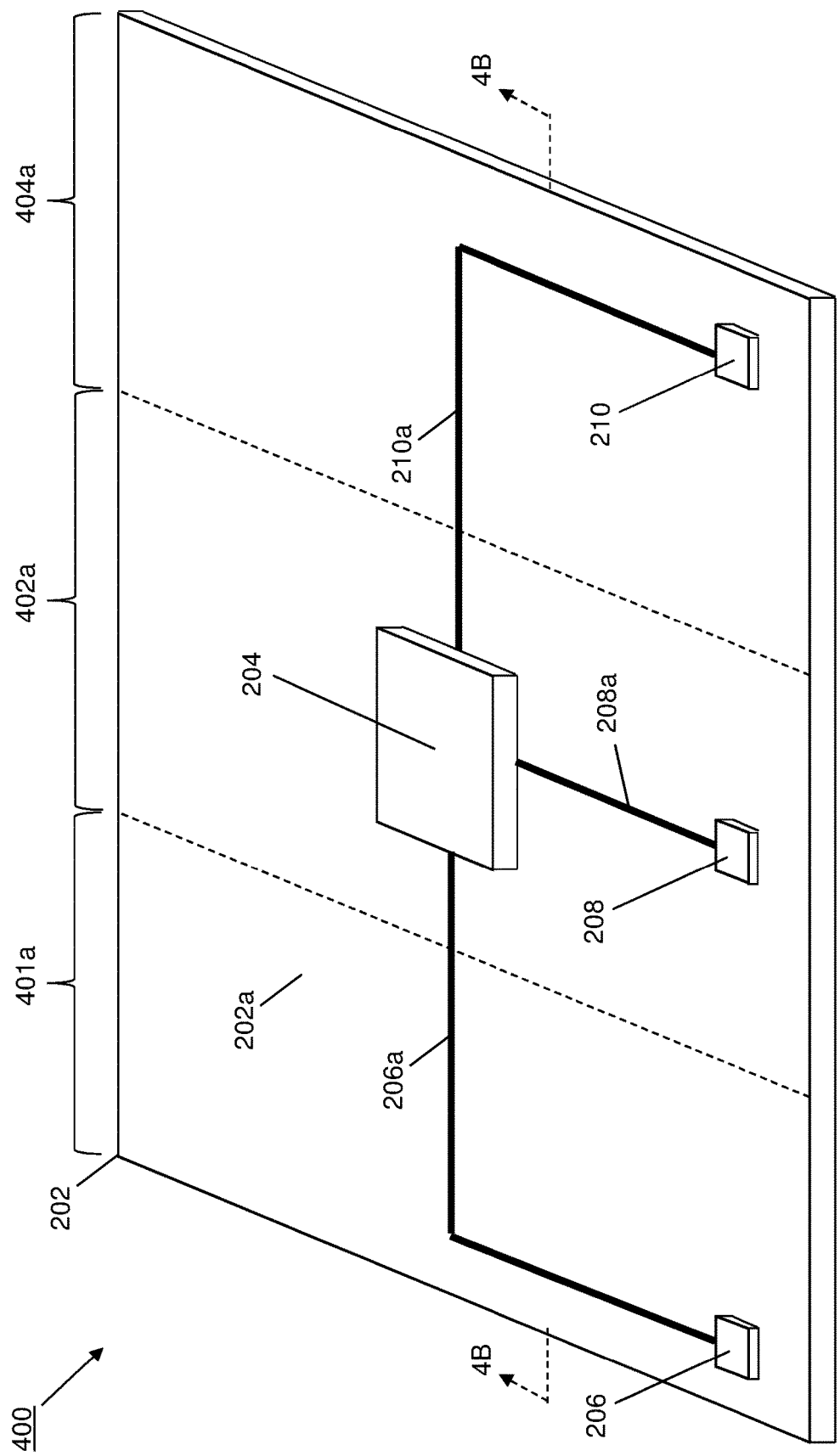
FIG. 4A is a top perspective view illustrating an embodiment of the circuit board of FIG. 2 including the zoned dielectric loss circuit board system of the present disclosure.
Figure 4B:
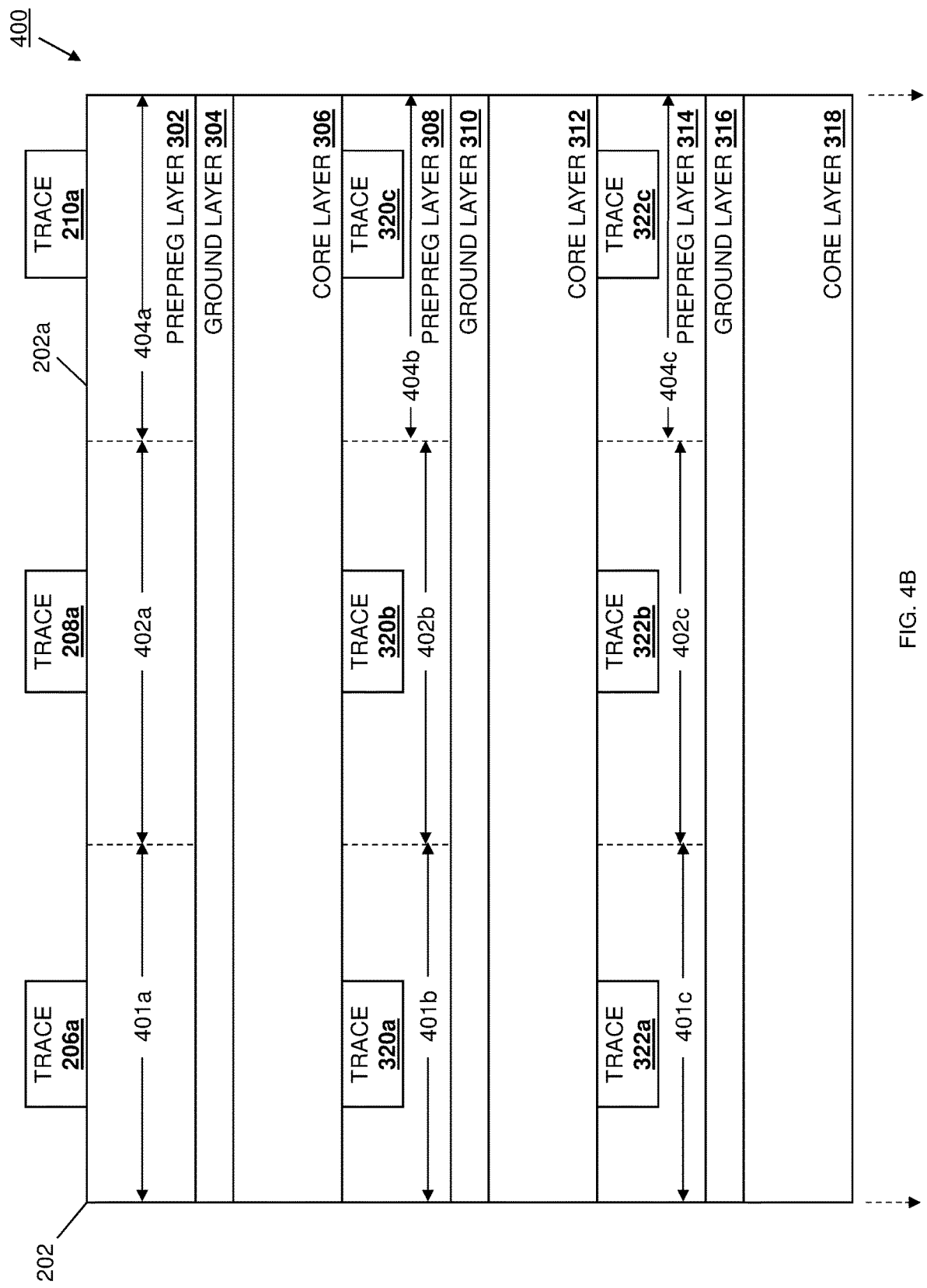
FIG. 4B is a cross-sectional view illustrating an embodiment of the circuit board of FIG. 4A.

With reference to FIGS. 4A and 4B, an embodiment of a circuit board 400 is illustrated that provides an example of the circuit board 200/300 discussed above with reference to FIGS. 2 and 3 configured with the zoned dielectric loss circuit board system of the present disclosure. In the embodiments illustrated and discussed with reference to FIGS. 4A and 4B below, the differential traces 206a, 208a, and 210a, the differential traces 320a-320c, and the differential traces 322a-322c are all configured to transmit the relatively high-speed signals discussed above, while the differential traces 206a/320a/322a and 210a/320c/322c exceed the trace length threshold and the differential traces 208a/320b/322b do not exceed the trace length threshold. Furthermore, each of the core layers 306 and 312 in this example may be provided using the "ultra-low-loss" dielectric materials discussed above, as one of skill in the art in possession of the present disclosure will recognize how the CCLs used to provide the ground layer/core layer/trace stacks may be provided by standard CCLs with uniform core layers (e.g., core layers with uniform dielectric loss characteristics). However, while standard CCLs with uniform dielectric loss core layers are described in this example, one of skill in the art in possession of the present disclosure will recognize that the core layers utilized with the zoned dielectric loss circuit board system of the present disclosure may be zoned with different dielectric loss materials similarly to the prepreg layers discussed below while remaining within the scope of the present disclosure.

In the illustrated embodiment, the prepreg layer 302 includes a first dielectric layer zone 401a that is provided by an "ultra-low-loss" dielectric material having relatively lower dielectric loss characteristics, a second dielectric layer zone 402a that is provided by a "low-loss" dielectric material having relatively higher dielectric loss characteristics than the "ultra-low-loss" dielectric material utilized in the first dielectric layer zone 401a, and a third dielectric layer zone 404a that is provided by the "ultra-low-loss" dielectric material utilized in the first dielectric layer zone 401a. As such, one of skill in the art in possession of the present disclosure will recognize that the dielectric medium provided by the first dielectric layer zone 401a in the prepreg layer 302 has "ultra-low" dielectric loss characteristics required to maintain signal integrity for signals transmitted by the differential trace 206a that has a trace length above the trace length threshold, the dielectric medium provided by the second dielectric layer zone 402a in the prepreg layer 302 has "low" dielectric loss characteristics required to maintain signal integrity for signals transmitted by the differential trace 208a that has a trace length below the trace length threshold, and the dielectric medium provided by the third dielectric layer zone 404a in the prepreg layer 302 has "ultra-low" dielectric loss characteristics required to maintain signal integrity for signals transmitted by the differential trace 210a that has a trace length above the trace length threshold.

Similarly, the prepreg layer 308 includes a first dielectric layer zone 401b that is provided by an "ultra-low-loss" dielectric material having relatively lower dielectric loss characteristics, a second dielectric layer zone 402b that is provided by a "low-loss" dielectric material having relatively higher dielectric loss characteristics than the "ultra-low-loss" dielectric material utilized in the first dielectric layer zone 401b, and a third dielectric layer zone 404b that is provided by the "ultra-low-loss" dielectric material utilized in the first dielectric layer zone 401b. As such, one of skill in the art in possession of the present disclosure will recognize that the dielectric medium provided by the core layer 306 and the first dielectric layer zone 401b in the prepreg layer 308 has "ultra-low" dielectric loss characteristics required to maintain signal integrity for signals transmitted by the differential trace 320a that has a trace length above the trace length threshold, the dielectric medium provided by the core layer 306 and second dielectric layer zone 402b in the prepreg layer 308 has "low" dielectric loss characteristics required to maintain signal integrity for signals transmitted by the differential trace 320b that has a trace length below the trace length threshold, and the dielectric medium provided by the core layer 306 and the third dielectric layer zone 404a in the prepreg layer 302 has "ultra-low" dielectric loss characteristics required to maintain signal integrity for signals transmitted by the differential trace 320c that has a trace length above the trace length threshold.

Similarly as well, the prepreg layer 314 includes a first dielectric layer zone 401c that is provided by an "ultra-low-loss" dielectric material having relatively lower dielectric loss characteristics, a second dielectric layer zone 402c that is provided by a "low-loss" dielectric material having relatively higher dielectric loss characteristics than the "ultra-low-loss" dielectric material utilized in the first dielectric layer zone 401c, and a third dielectric layer zone 404c that is provided by the "ultra-low-loss" dielectric material utilized in the first dielectric layer zone 401c. As such, one of skill in the art in possession of the present disclosure will recognize that the dielectric medium provided by the core layer 312 and the first dielectric layer zone 401c in the prepreg layer 314 has "ultra-low" dielectric loss characteristics required to maintain signal integrity for signals transmitted by the differential trace 322a that has a trace length above the trace length threshold, the dielectric medium provided by the core layer 312 and second dielectric layer zone 402c in the prepreg layer 314 has "low" dielectric loss characteristics required to maintain signal integrity for signals transmitted by the differential trace 322b that has a trace length below the trace length threshold, and the dielectric medium provided by the core layer 312 and the third dielectric layer zone 404c in the prepreg layer 314 has "ultra-low" dielectric loss characteristics required to maintain signal integrity for signals transmitted by the differential trace 322c that has a trace length above the trace length threshold. Thus, the zoned dielectric loss circuit board system of the present disclosure may be associated with lower costs relative to the conventional circuit boards discussed above due to the use of the relatively lower cost "low-loss" dielectric material in the second dielectric layer zones 402a, 402b, and 402c in the prepreg layers 302, 308, and 314, respectively.

As will be appreciated by one of skill in the art in possession of the present disclosure, in a specific example the manufacture of the circuit board 400 may be accomplished similarly as described above for the circuit board 200/300 discussed above, with the exception that the first dielectric layer zone 401c, second dielectric layer zone 402c, and third dielectric layer zone 404c in the prepreg layer 314 may be provided on the ground layer 316 separately (e.g., as separate sheets of prepreg positioned immediately adjacent each other). Similarly, the first dielectric layer zone 401b, second dielectric layer zone 402b, and third dielectric layer zone 404b in the prepreg layer 308 may be provided on the ground layer 310 separately (e.g., as separate sheets of prepreg positioned immediately adjacent each other); and the first dielectric layer zone 401a, second dielectric layer zone 402a, and third dielectric layer zone 404a in the prepreg layer 302 may be provided on the ground layer 304 separately (e.g., as separate sheets of prepreg positioned immediately adjacent each other). However, while the different dielectric layer zones in any particular prepreg layer are discussed as being provided by separate sheets of prepreg, prepreg manufacturing techniques that provide a single sheet of a prepreg layer with different dielectric layer zones is envisioned as falling within the scope of the present disclosure as well.

As will be appreciated by one of skill in the art in possession of the present disclosure, the different dielectric layer zones in any prepreg layer on the circuit board may be provided by dielectric materials that are configured to flow freely at their boundaries (e.g., the edges of adjacent first and second dielectric layer zone prepreg sheets, and the edges of adjacent second and third dielectric layer zone prepreg sheets in the examples above). For example, dielectric materials such as Megtron 6 dielectric materials, Megtron 7 dielectric materials, and 1755R dielectric materials have been identified by the inventor of the present disclosure as appropriate dielectric materials for the different dielectric layer zone prepreg sheets in a prepreg layer, although one of skill in the art in possession of the present disclosure will appreciate that other dielectric materials will fall within the scope of the present disclosure as well. Furthermore, one of skill in the art in possession of the present disclosure will appreciate that trace and ground layer surfaces may be provided with Hyper Very Low Profile (HVLP) finishes in order to enhance the engagement of the traces/ground layers with the dielectric layer zone prepreg sheets in the prepreg layers.

Furthermore, while the example illustrated and discussed above describes a particular number of dielectric layer zones in each prepreg layer (e.g., the "ultra-low-loss" dielectric layer zones 401*a* and 404*a* adjacent the differential traces 206*a* and 210*a*, respectively, and the "low-loss" dielectric layer zone 402*a* adjacent the differential trace 208*a* in the prepreg zone 302; the "ultra-low-loss" dielectric layer zones 401*b* and 404*b* adjacent the differential traces 320*a* and 320*c*, respectively, and the "low-loss" dielectric layer zone 402*b* adjacent the differential trace 320*b* in the prepreg zone 308; and the "ultra-low-loss" dielectric layer zones 401*c* and 404*c* adjacent the differential traces 322*a* and 322*c*, respectively, and the "low-loss" dielectric layer zone 402*c* adjacent the differential trace 322*b* in the prepreg zone 314), one of skill in the art in possession of the present disclosure will appreciate that different numbers of dielectric layer zones in any particular prepreg layer will fall within the scope of the present disclosure as well. For example, three (or more) different length differential traces immediately adjacent a prepreg layer may each have respective dielectric layer zones immediately adjacent them that each include different dielectric loss characteristics while remaining within the scope of the present disclosure as well.

Furthermore, while the differential traces 206*a*, 210*a*, 320*a*, 320*c*, 322*a*, and 322*c* are described herein as being configured to transmit relatively high speed signals and having a trace length that exceeds the trace length threshold, thus requiring their immediately adjacent dielectric medium to be provided by an "ultra-low-loss" dielectric material, one of skill in the art in possession of the present disclosure will recognize that if any of those differential traces (e.g., the differential trace 210*a*) was configured to transmit relatively low speed signals, the dielectric medium immediately adjacent that differential trace (e.g., the differential trace 210*a*) could be provided with a "low-loss" dielectric material while still allowing that differential trace (e.g., the differential trace 210*a*) to transmit signals without degradation above the signal integrity threshold.

Figure 5:
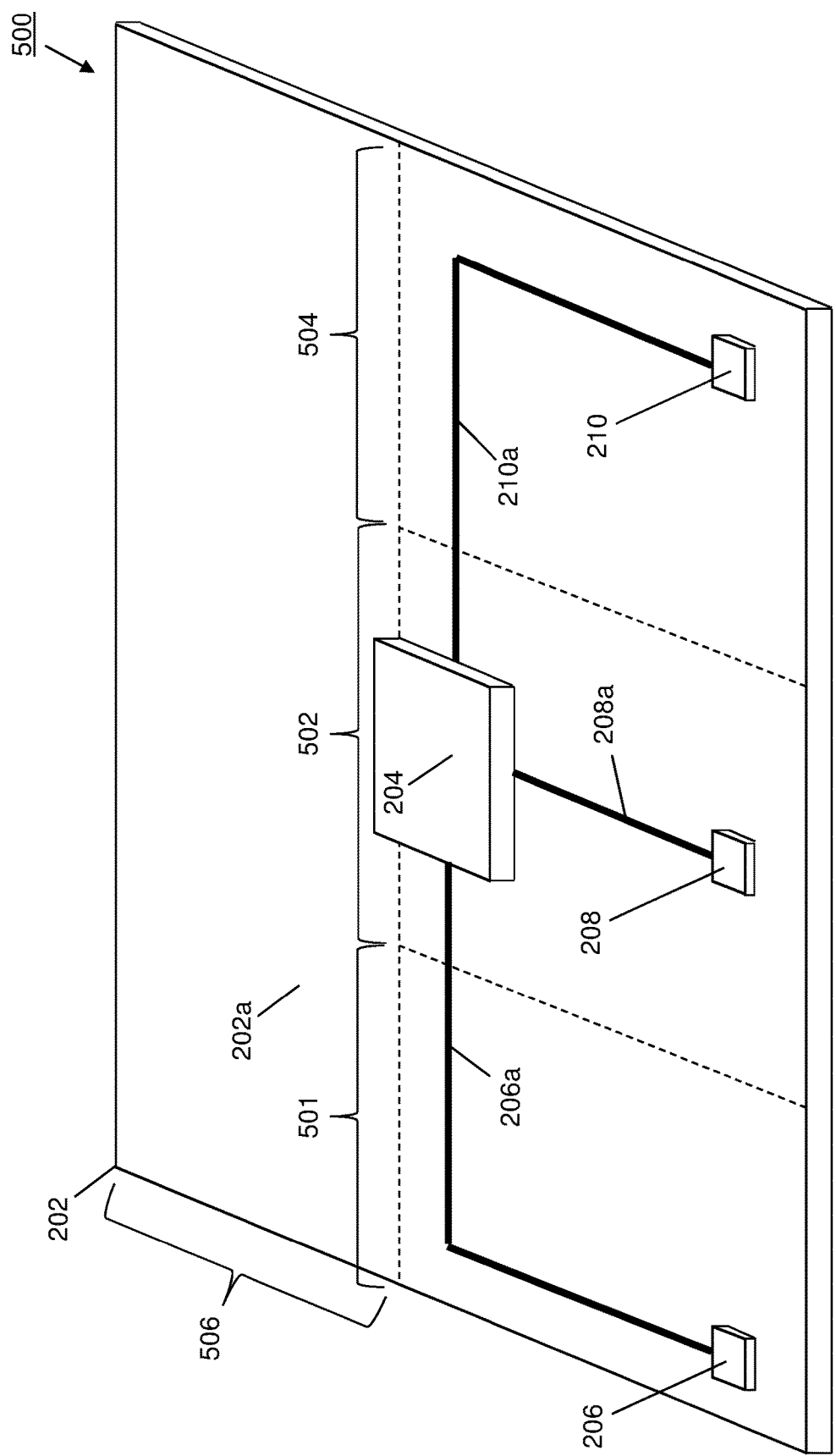
FIG. 5 is a top perspective view illustrating an embodiment of the circuit board of FIG. 2 including the zoned dielectric loss circuit board system of the present disclosure.

With reference to FIG. 5, an embodiment of a circuit board 500 is illustrated that provides an example of the circuit board 200/300 discussed above with reference to FIGS. 2 and 3 configured with the zoned dielectric loss circuit board system of the present disclosure. In the embodiments illustrated in FIG. 5, the differential traces 206*a*, 208*a*, and 210*a*, the differential traces 320*a*-320*c*, and the differential traces 322*a*-322*c* are all configured to transmit the relatively high-speed signals discussed above, while the differential traces 206*a*/320*a*/322*a* and 210*a*/320*c*/322*c* exceed the trace length threshold and the differential traces 208*a*/320*b*/322*b* do not exceed the trace length threshold. Similarly as discussed above, each of the core layers 306 and 312 in the circuit board 500 may be provided using the "ultra-low-loss" dielectric materials, as one of skill in the art in possession of the present disclosure will recognize how the CCLs used to provide the ground layer/core layer/trace stacks may be provided by standard CCLs with uniform core layers (e.g., core layers with uniform dielectric loss characteristics). However, while standard CCLs with uniform core layers are described in this example, one of skill in the art in possession of the present disclosure will recognize that the core layers utilized here may be zoned with different dielectric loss materials similarly to the prepreg layers discussed below while remaining within the scope of the present disclosure.

In the illustrated embodiment, the prepreg layer 302 includes a first dielectric layer zone 501 that is provided by an "ultra-low-loss" dielectric material having relatively lower dielectric loss characteristics, a second dielectric layer zone 502 that is provided by a "low-loss" dielectric material having relatively higher dielectric loss characteristics than the "ultra-low-loss" dielectric material utilized in the first dielectric layer zone 501, a third dielectric layer zone 504 that is provided by the "ultra-low-loss" dielectric material utilized in the first dielectric layer zone 501, and a fourth dielectric layer zone 506 that is provided by a "standard-loss" dielectric material having relatively higher dielectric loss characteristics than the "low-loss" dielectric material utilized in the second dielectric layer zone 502. As such, one of skill in the art in possession of the present disclosure will recognize that the dielectric medium provided by the first dielectric layer zone 501 in the prepreg layer 302 has "ultra-low" dielectric loss characteristics required to maintain signal integrity for signals transmitted by the differential trace 206*a* that has a trace length above the trace length threshold, the dielectric medium provided by the second dielectric layer zone 502 in the prepreg layer 302 has "low" dielectric loss characteristics required to maintain signal integrity for signals transmitted by the differential trace 208*a* that has a trace length below the trace length threshold, the dielectric medium provided by the third dielectric layer zone 504 in the prepreg layer 302 has "ultra-low" dielectric loss characteristics required to maintain signal integrity for signals transmitted by the differential trace 210*a* that has a trace length above the trace length threshold, and the dielectric medium provided by the fourth dielectric layer zone 506 in the prepreg layer 302 has "standard" dielectric loss characteristics that are sufficient due to, for example, there being no differential traces located adjacent the fourth dielectric layer zone 506 in the prepreg layer 302 in the illustrated example.

While not specifically illustrated or described herein, one of skill in the art in possession of the present disclosure will recognize how the prepreg layers 308 and 314 may include first, second, third, and fourth dielectric layer zones that are substantially similar to the first dielectric layer zone 501, the second dielectric layer zone 502, the third dielectric layer zone 504, and the fourth dielectric layer zone 506 in the prepreg layer 302 (e.g., as described above for the circuit board 400). Thus, the zoned dielectric loss circuit board system of the present disclosure may be associated with lower costs relative to the conventional circuit boards discussed above due to the use of the relatively lower cost "low-loss" dielectric material in the second dielectric layer zone 502 in the prepreg layer 302 and second dielectric layer zones in the prepreg layers 308*a* and 314, as well as the use of the relatively lower cost "standard-loss" dielectric material in the fourth dielectric layer zone 506 in the prepreg layer 302 and fourth dielectric layer zones in the prepreg layers 308*a* and 314. Furthermore, one of skill in the art in possession of the present disclosure will appreciate how the circuit board 500 may be manufactured similarly as discussed above with respect to the circuit board 400.

Figure 6:
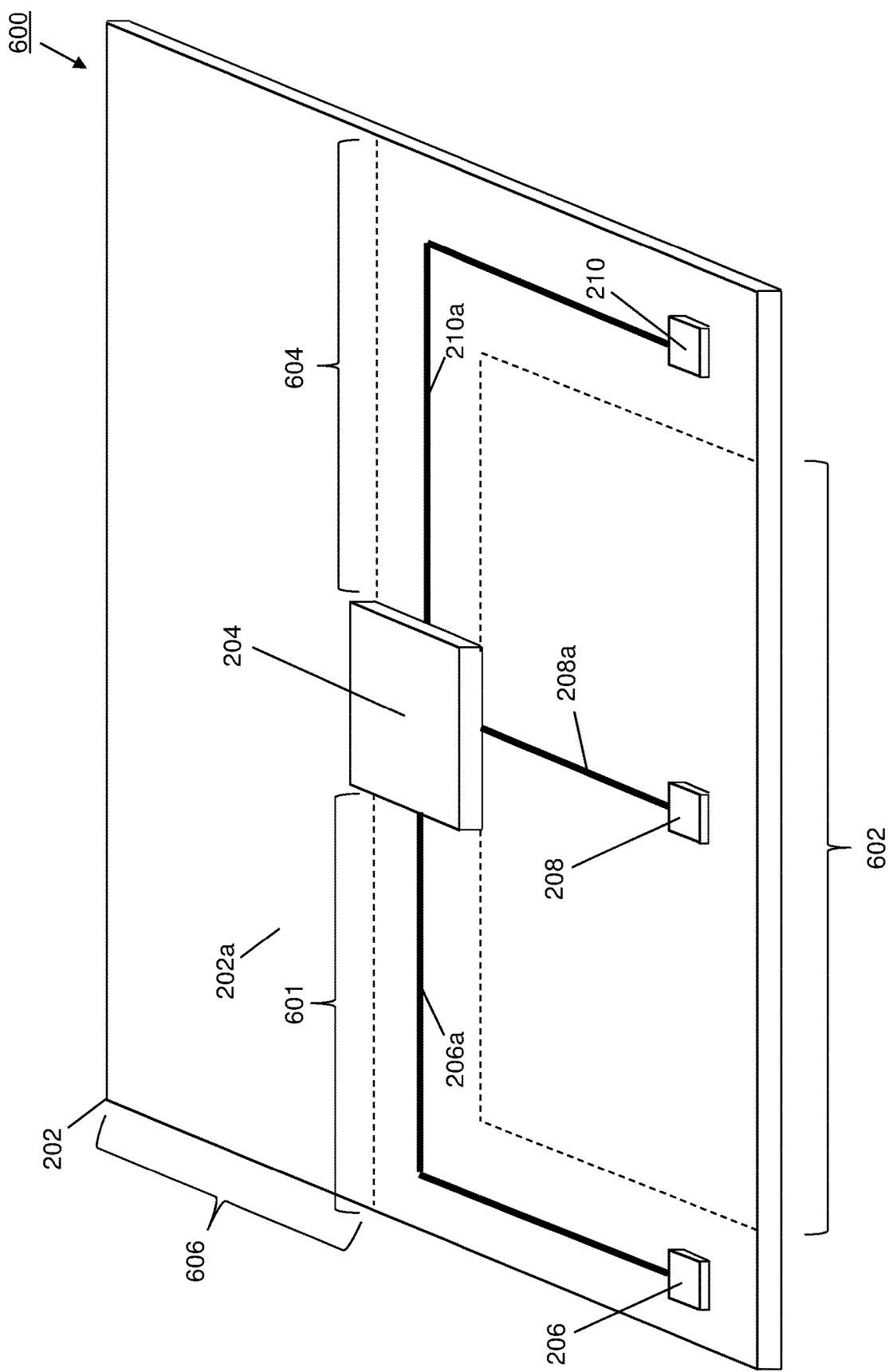
FIG. 6 is a top perspective view illustrating an embodiment of the circuit board of FIG. 2 including the zoned dielectric loss circuit board system of the present disclosure.

With reference to FIG. 6, an embodiment of a circuit board 600 is illustrated that provides an example of the circuit board 200/300 discussed above with reference to FIGS. 2 and 3 configured with the zoned dielectric loss circuit board system of the present disclosure. In the embodiments illustrated in FIG. 6, the differential traces 206*a*, 208*a*, and 210*a*, the differential traces 320*a*-320*c*, and the differential traces 322*a*-322*c* are all configured to transmit the relatively high-speed signals discussed above, while the differential traces 206*a*/320*a*/322*a* and 210*a*/320*c*/322*c* exceed the trace length threshold and the differential traces 208*a*/320*b*/322*b* do not exceed the trace length threshold. Similarly as discussed above, each of the core layers 306 and 312 in the circuit board 600 may be provided using the "ultra-low-loss" dielectric materials, as one of skill in the art in possession of the present disclosure will recognize how the CCLs used to provide the ground layer/core layer/trace stacks may be provided by standard CCLs with uniform core layers (e.g., core layers with uniform dielectric loss characteristics). However, while standard CCLs with uniform core layers are described in this example, one of skill in the art in possession of the present disclosure will recognize that the core layers utilized here may be zoned with different dielectric loss materials similarly to the prepreg layers discussed below while remaining within the scope of the present disclosure.

In the illustrated embodiment, the prepreg layer 302 includes a first dielectric layer zone 601 that is provided by an "ultra-low-loss" dielectric material having relatively lower dielectric loss characteristics, a second dielectric layer zone 602 that is provided by a "low-loss" dielectric material having relatively higher dielectric loss characteristics than the "ultra-low-loss" dielectric material utilized in the first dielectric layer zone 601, a third dielectric layer zone 604 that is provided by the "ultra-low-loss" dielectric material utilized in the first dielectric layer zone 601, and a fourth dielectric layer zone 606 that is provided by a "standard-loss" dielectric material having relatively higher dielectric loss characteristics than the "low-loss" dielectric material utilized in the second dielectric layer zone 602. As such, one of skill in the art in possession of the present disclosure will recognize that the dielectric medium provided by the first dielectric layer zone 601 in the prepreg layer 302 has "ultra-low" dielectric loss characteristics required to maintain signal integrity for signals transmitted by the differential trace 206a that has a trace length above the trace length threshold, the dielectric medium provided by the second dielectric layer zone 602 in the prepreg layer 302 has "low" dielectric loss characteristics required to maintain signal integrity for signals transmitted by the differential trace 208a that has a trace length below the trace length threshold, the dielectric medium provided by the third dielectric layer zone 604 in the prepreg layer 302 has "ultra-low" dielectric loss characteristics required to maintain signal integrity for signals transmitted by the differential trace 210a that has a trace length above the trace length threshold, and the dielectric medium provided by the fourth dielectric layer zone 606 in the prepreg layer 302 has "standard" dielectric loss characteristics that are sufficient due to, for example, there being no differential traces located adjacent the fourth dielectric layer zone 506 in the prepreg layer 302 in the illustrated example.

While not specifically illustrated or described herein, one of skill in the art in possession of the present disclosure will recognize how the prepreg layers 308 and 314 may include first, second, third, and fourth dielectric layer zones that are substantially similar to the first dielectric layer zone 601, the second dielectric layer zone 602, the third dielectric layer zone 604, and the fourth dielectric layer zone 606 in the prepreg layer 302 (e.g., as described above for the circuit board 400). Thus, the zoned dielectric loss circuit board system of the present disclosure may be associated with lower costs relative to the conventional circuit boards discussed above due to the minimized use of the relatively higher cost "ultra-low-loss" dielectric material in the first dielectric layer zone 601 and the third dielectric layer zone 604 in the prepreg layer 302 (e.g., only along the path of the traces 206a and 210a, respectively) and the first and third dielectric layer zones in the prepreg layers 308 and 314, the use of the relatively lower cost "low-loss" dielectric material in the second dielectric layer zone 602 in the prepreg layer 302 and second dielectric layer zones in the prepreg layers 308 and 314, as well as the use of the relatively lower cost "standard-loss" dielectric material in the fourth dielectric layer zone 606 in the prepreg layer 302 and fourth dielectric layer zones in the prepreg layers 308 and 314. Furthermore, one of skill in the art in possession of the present disclosure will appreciate how the circuit board 600 may be manufactured similarly as discussed above with respect to the circuit board 400.

Figure 7:
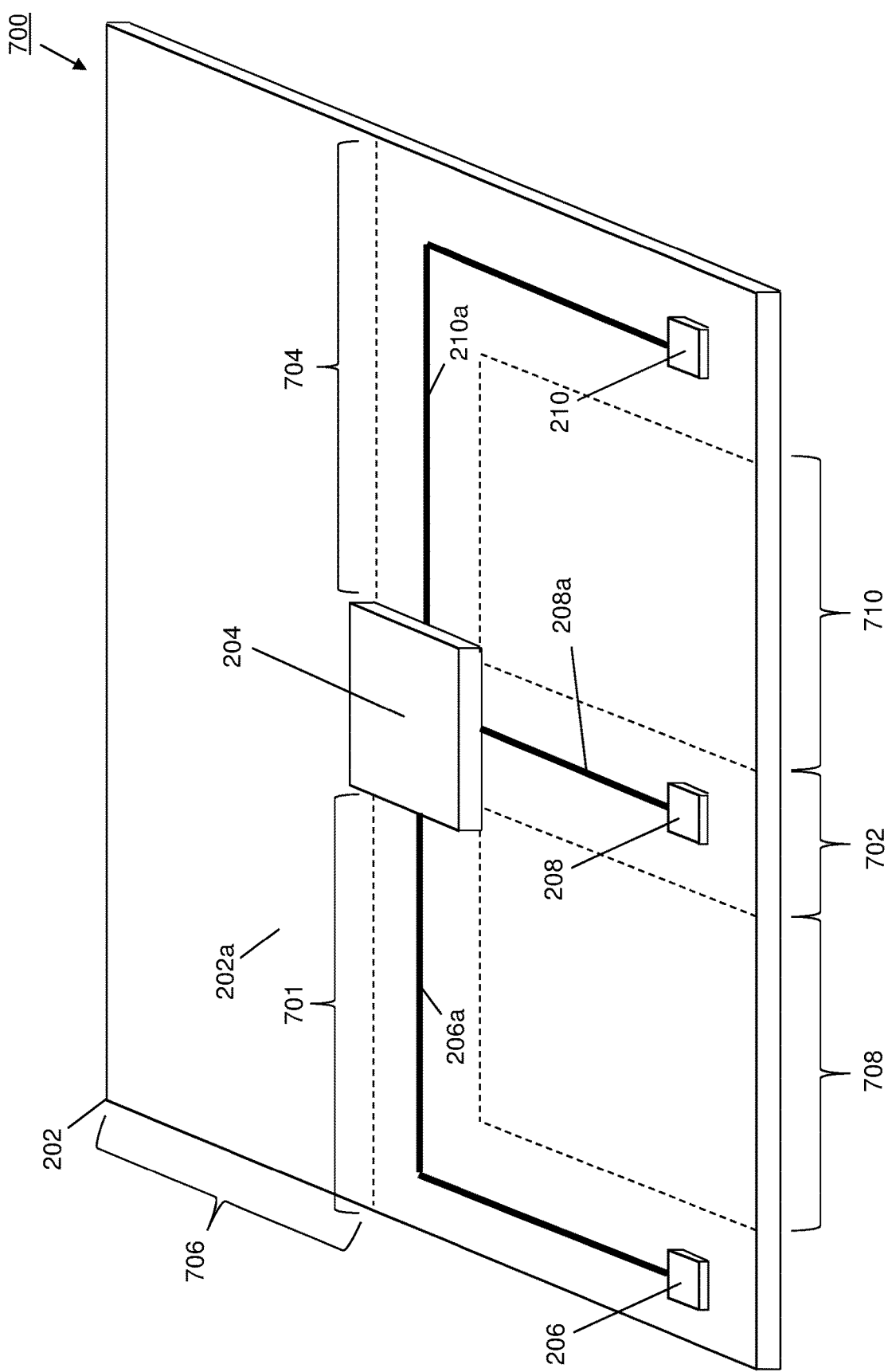
FIG. 7 is a top perspective view illustrating an embodiment of the circuit board of FIG. 2 including the zoned dielectric loss circuit board system of the present disclosure.

With reference to FIG. 7, an embodiment of a circuit board 700 is illustrated that provides an example of the circuit board 200/300 discussed above with reference to FIGS. 2 and 3 configured with the zoned dielectric loss circuit board system of the present disclosure. In the embodiments illustrated in FIG. 7, the differential traces 206a, 208a, and 210a, the differential traces 320a-320c, and the differential traces 322a-322c are all configured to transmit the relatively high-speed signals discussed above, while the differential traces 206a/320a/322a and 210a/320c/322c exceed the trace length threshold and the differential traces 208a/320b/322b do not exceed the trace length threshold. Similarly as discussed above, each of the core layers 306 and 312 in the circuit board 700 may be provided using the "ultra-low-loss" dielectric materials, as one of skill in the art in possession of the present disclosure will recognize how the CCLs used to provide the ground layer/core layer/trace stacks may be provided by standard CCLs with uniform core layers (e.g., core layers with uniform dielectric loss characteristics). However, while standard CCLs with uniform core layers are described in this example, one of skill in the art in possession of the present disclosure will recognize that the core layers utilized here may be zoned with different dielectric loss materials similarly to the prepreg layers discussed below while remaining within the scope of the present disclosure.

In the illustrated embodiment, the prepreg layer 302 includes a first dielectric layer zone 701 that is provided by an "ultra-low-loss" dielectric material having relatively lower dielectric loss characteristics, a second dielectric layer zone 702 that is provided by a "low-loss" dielectric material having relatively higher dielectric loss characteristics than the "ultra-low-loss" dielectric material utilized in the first dielectric layer zone 701, a third dielectric layer zone 704 that is provided by the "ultra-low-loss" dielectric material utilized in the first dielectric layer zone 701, a fourth dielectric layer zone 706 that is provided by a "standard-loss" dielectric material having relatively higher dielectric loss characteristics than the "low-loss" dielectric material utilized in the second dielectric layer zone 702, a fifth dielectric layer zone 708 that is provided by the "standard-loss" dielectric material utilized in the fourth dielectric layer zone 706, and a sixth dielectric layer zone 710 that is provided by the "standard-loss" dielectric material utilized in the fourth dielectric layer zone 706.

As such, one of skill in the art in possession of the present disclosure will recognize that the dielectric medium provided by the first dielectric layer zone 701 in the prepreg layer 302 has "ultra-low" dielectric loss characteristics required to maintain signal integrity for signals transmitted by the differential trace 206a that has a trace length above the trace length threshold, the dielectric medium provided by the second dielectric layer zone 702 in the prepreg layer 302 has "low" dielectric loss characteristics required to maintain signal integrity for signals transmitted by the differential trace 208a that has a trace length below the trace length threshold, the dielectric medium provided by the third dielectric layer zone 704 in the prepreg layer 302 has "ultra-low" dielectric loss characteristics required to maintain signal integrity for signals transmitted by the differential trace 210a that has a trace length above the trace length threshold, and the dielectric medium provided by the fourth dielectric layer zone 706, fifth dielectric layer zone 708, and sixth dielectric layer zone 710 in the prepreg layer 302 have "standard" dielectric loss characteristics that are sufficient due to, for example, there being no differential traces located adjacent the fourth dielectric layer zone 706, fifth dielectric layer zone 708, and sixth dielectric layer zone 710 in the prepreg layer 302 in the illustrated example.

While not specifically illustrated or described herein, one of skill in the art in possession of the present disclosure will recognize how the prepreg layers 308 and 314 may include first, second, third, fourth, fifth, and sixth dielectric layer zones that are substantially similar to the first dielectric layer zone 701, the second dielectric layer zone 702, the third dielectric layer zone 704, the fourth dielectric layer zone 706, the fifth dielectric layer zone 708, and the sixth dielectric layer zone 710 in the prepreg layer 302 (e.g., as described above for the circuit board 400). Thus, the zoned dielectric loss circuit board system of the present disclosure may be associated with lower costs relative to the conventional circuit boards discussed above due to the minimized use of the relatively higher cost "ultra-low-loss" dielectric material in the first dielectric layer zone 701 and the third dielectric layer zone 704 in the prepreg layer 302 (e.g., only along the path of the traces 206a and 210a, respectively) and the first and third dielectric layer zones in the prepreg layers 308 and 314, the minimized use of the relatively lower cost "low-loss" dielectric material in the second dielectric layer zone 702 in the prepre layer 302 (e.g., only along the path of the trace 208a) and second dielectric layer zones in the prepreg layers 308 and 314, as well as the use of the relatively lower cost "standard-loss" dielectric material in the fourth dielectric layer zone 706, fifth dielectric layer zone 708, and sixth dielectric layer zone 710 in the prepreg layer 302 and fourth, fifth, and sixth dielectric layer zones in the prepreg layers 308 and 314. Furthermore, one of skill in the art in possession of the present disclosure will appreciate how the circuit board 700 may be manufactured similarly as discussed above with respect to the circuit board 400.

Figure 8:
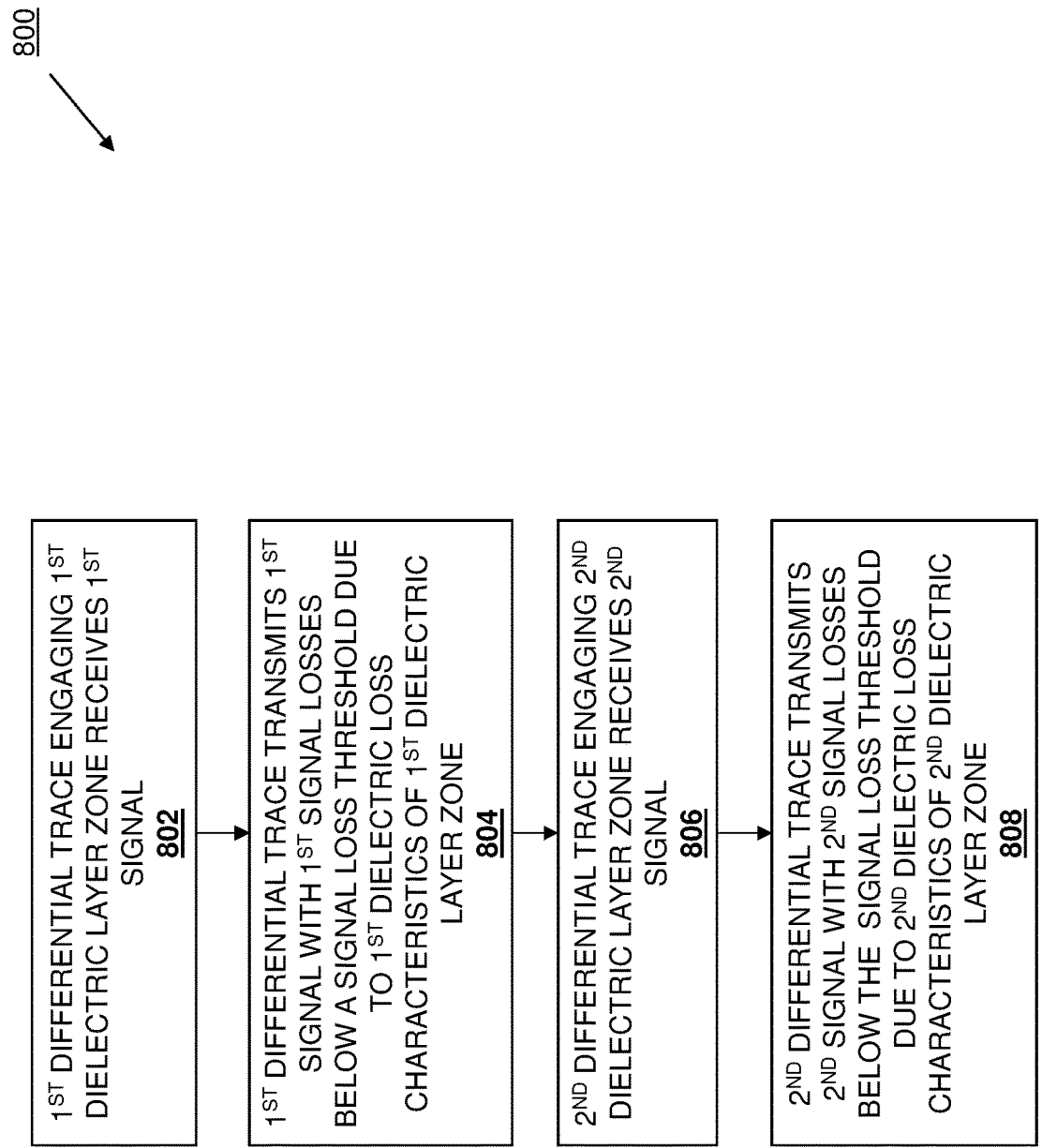
FIG. 8 is a flow chart illustrating an embodiment of a method for transmitting signals in a zoned dielectric loss circuit board.

Referring now to FIG. 8, an embodiment of a method 800 for transmitting signals in a zoned dielectric loss circuit board is illustrated. As discussed below, the systems and methods of the present disclosure provide a dielectric layer/horizontal dielectric plane in a circuit board with different dielectric layer zones having different dielectric characteristics such that differential traces that require their immediately adjacent dielectric layers to have relatively lower loss dielectric characteristics may be provided immediately adjacent dielectric layer zones with relatively lower loss dielectric characteristics, and differential traces that do not require their immediately adjacent dielectric layers to have relatively lower loss dielectric characteristics may be provided immediately adjacent dielectric layer zones with relatively higher loss dielectric characteristics. For example, the zoned dielectric loss circuit board system of the present disclosure may include a board. A first differential trace is included in the board. A dielectric layer is included the board and has a first dielectric layer zone that engages the first differential trace and that includes first dielectric loss characteristics, and a second dielectric layer zone that is located immediately adjacent the first dielectric layer zone and that includes second dielectric loss characteristics that are greater than the first dielectric loss characteristics. A second differential trace may be included in the board in engagement with the second dielectric layer zone and may have a second trace length that is shorter than a first trace length of the first differential trace. As such, lower cost boards may be provided via the use of relatively lower costs dielectric materials without suffering negative effects on signal integrity.

The method 800 begins at block 802 where a first differential trace engaging a first dielectric layer zone receives a first signal. In an embodiment, at block 802, the processing system 204 may generate and transmit a signal such that the signal is received by the differential trace 206a that engages the first dielectric layer zone 401a. While the specific example provided herein discusses a signal received by the differential trace 206a of FIGS. 4A and 4B, one of skill in the art in possession of the present disclosure will appreciate that the differential trace 206a of FIG. 5, 6, or 7, as well as the differential traces 320a, 322a, 210a, 320c, 322c of FIG. 4A, 4B, 5, 6, or 7 engaging their respective dielectric layer zones discussed above may receive the signal at block 802 while remaining within the scope of the present disclosure as well.

The method 800 then proceeds to block 804 where the first differential trace transmits the first signal with first signal losses below a signal loss threshold due to first dielectric loss characteristics of the first dielectric layer zone. In an embodiment, at block 804, the differential trace 206a may transmit the signal received from the processing system 204 along its length to the connector 206. While the specific example provided herein discusses a signal transmitted by the differential trace 206a, one of skill in the art in possession of the present disclosure will appreciate that the differential traces 320a and/or 322a may transmit the signal to the connector 206 at block 804, and/or the differential traces 210a, 320c, and/or 322c may transmit the signal to the connector 210 at block 804, while remaining within the scope of the present disclosure as well.

With reference to FIGS. 4A and 4B, the transmission of the signal by the differential trace 206a will result in first signal losses that are below a signal loss threshold due to dielectric loss characteristics of the "ultra-low-loss" dielectric material used to provide the first dielectric layer zone 401a. Similarly, the transmission of the signal by the differential trace 320a will result in first signal losses that are below a signal loss threshold due to dielectric loss characteristics of the "ultra-low-loss" dielectric material used to provide the first dielectric layer zone 401b, the transmission of the signal by the differential trace 322a will result in first signal losses that are below a signal loss threshold due to dielectric loss characteristics of the "ultra-low-loss" dielectric material used to provide the first dielectric layer zone 401c, the transmission of the signal by the differential trace 210a will result in first signal losses that are below a signal loss threshold due to dielectric loss characteristics of the "ultra-low-loss" dielectric material used to provide the first dielectric layer zone 404a, the transmission of the signal by the differential trace 320c will result in first signal losses that are below a signal loss threshold due to dielectric loss characteristics of the "ultra-low-loss" dielectric material used to provide the first dielectric layer zone 404b, and the transmission of the signal by the differential trace 322c will result in first signal losses that are below a signal loss threshold due to dielectric loss characteristics of the "ultra-low-loss" dielectric material used to provide the first dielectric layer zone 404c.

With reference to FIG. 5, the transmission of the signal by the differential trace 206a will result in first signal losses that are below a signal loss threshold due to dielectric loss characteristics of the "ultra-low-loss" dielectric material used to provide the first dielectric layer zone 501, and one of skill in the art in possession of the present disclosure will appreciate how the transmission of the signal by the differential traces 320*a* and 322*a* will result in first signal losses that are below a signal loss threshold due to dielectric loss characteristics of the "ultra-low-loss" dielectric material used to provide their respective immediately adjacent first dielectric layer zones. Similarly, the transmission of the signal by the differential trace 210*a* will result in first signal losses that are below a signal loss threshold due to dielectric loss characteristics of the "ultra-low-loss" dielectric material used to provide the third dielectric layer zone 504, and one of skill in the art in possession of the present disclosure will appreciate how the transmission of the signal by the differential traces 320*c* and 322*c* will result in first signal losses that are below a signal loss threshold due to dielectric loss characteristics of the "ultra-low-loss" dielectric material used to provide their respective immediately adjacent third dielectric layer zones.

With reference to FIG. 6, the transmission of the signal by the differential trace 206*a* will result in first signal losses that are below a signal loss threshold due to dielectric loss characteristics of the "ultra-low-loss" dielectric material used to provide the first dielectric layer zone 601, and one of skill in the art in possession of the present disclosure will appreciate how the transmission of the signal by the differential traces 320*a* and 322*a* will result in first signal losses that are below a signal loss threshold due to dielectric loss characteristics of the "ultra-low-loss" dielectric material used to provide their respective immediately adjacent first dielectric layer zones. Similarly, the transmission of the signal by the differential trace 210*a* will result in first signal losses that are below a signal loss threshold due to dielectric loss characteristics of the "ultra-low-loss" dielectric material used to provide the third dielectric layer zone 604, and one of skill in the art in possession of the present disclosure will appreciate how the transmission of the signal by the differential traces 320*c* and 322*c* will result in first signal losses that are below a signal loss threshold due to dielectric loss characteristics of the "ultra-low-loss" dielectric material used to provide their respective immediately adjacent third dielectric layer zones.

With reference to FIG. 7, the transmission of the signal by the differential trace 206*a* will result in first signal losses that are below a signal loss threshold due to dielectric loss characteristics of the "ultra-low-loss" dielectric material used to provide the first dielectric layer zone 701, and one of skill in the art in possession of the present disclosure will appreciate how the transmission of the signal by the differential traces 320*a* and 322*a* will result in first signal losses that are below a signal loss threshold due to dielectric loss characteristics of the "ultra-low-loss" dielectric material used to provide their respective immediately adjacent first dielectric layer zones. Similarly, the transmission of the signal by the differential trace 210*a* will result in first signal losses that are below a signal loss threshold due to dielectric loss characteristics of the "ultra-low-loss" dielectric material used to provide the third dielectric layer zone 704, and one of skill in the art in possession of the present disclosure will appreciate how the transmission of the signal by the differential traces 320*c* and 322*c* will result in first signal losses that are below a signal loss threshold due to dielectric loss characteristics of the "ultra-low-loss" dielectric material used to provide their respective immediately adjacent third dielectric layer zones.

The method 800 then proceeds to block 806 where a second differential trace engaging a second dielectric layer zone receives a second signal. In an embodiment, at block 806, the processing system 204 may generate and transmit a signal such that the signal is received by the differential trace 208*a* that engages the second dielectric layer zone 402*a*. While the specific example provided herein discusses a signal received by the differential trace 208*a* of FIGS. 4A and 4B, one of skill in the art in possession of the present disclosure will appreciate that the differential trace 208*a* of FIG. 5, 6, or 7, as well as the differential traces 320*b* and 322*b* engaging their respective dielectric layer zones discussed above may receive the signal at block 806 while remaining within the scope of the present disclosure as well The method 800 then proceeds to block 808 where the second differential trace transmits the second signal with second signal losses below the signal loss threshold due to second signal loss characteristics of the second dielectric layer zone. In an embodiment, at block 808, the differential trace 208*a* may transmit the signal received from the processing system 204 along its length to the connector 208. While the specific example provided herein discusses a signal transmitted by the differential trace 208*a*, one of skill in the art in possession of the present disclosure will appreciate that the differential traces 320*b* and/or 322*b* may transmit the signal to the connector 208 at block 804 while remaining within the scope of the present disclosure as well.

With reference to FIGS. 4A and 4B, the transmission of the signal by the differential trace 208*a* will result in second signal losses that are below the signal loss threshold due to dielectric loss characteristics of the "low-loss" dielectric material used to provide the second dielectric layer zone 402*a*. Similarly, the transmission of the signal by the differential trace 320*b* will result in second signal losses that are below the signal loss threshold due to dielectric loss characteristics of the "low-loss" dielectric material used to provide the second dielectric layer zone 402*b*, and the transmission of the signal by the differential trace 322*b* will result in second signal losses that are below the signal loss threshold due to dielectric loss characteristics of the "low-loss" dielectric material used to provide the second dielectric layer zone 402*c*.

With reference to FIG. 5, the transmission of the signal by the differential trace 208*a* will result in second signal losses that are below the signal loss threshold due to dielectric loss characteristics of the "low-loss" dielectric material used to provide the second dielectric layer zone 502, and one of skill in the art in possession of the present disclosure will appreciate how the transmission of the signal by the differential traces 320*b* and 322*b* will result in second signal losses that are below the signal loss threshold due to dielectric loss characteristics of the "low-loss" dielectric material used to provide their respective immediately adjacent second dielectric layer zones.

With reference to FIG. 6, the transmission of the signal by the differential trace 208*a* will result in second signal losses that are below the signal loss threshold due to dielectric loss characteristics of the "low-loss" dielectric material used to provide the second dielectric layer zone 602, and one of skill in the art in possession of the present disclosure will appreciate how the transmission of the signal by the differential traces 320*b* and 322*b* will result in second signal losses that are below the signal loss threshold due to dielectric loss characteristics of the "low-loss" dielectric material used to provide their respective immediately adjacent second dielectric layer zones.

With reference to FIG. 7, the transmission of the signal by the differential trace 208*a* will result in second signal losses that are below the signal loss threshold due to dielectric loss characteristics of the "low-loss" dielectric material used to provide the second dielectric layer zone 702, and one of skill in the art in possession of the present disclosure will appreciate how the transmission of the signal by the differential traces 320b and 322b will result in second signal losses that are below the signal loss threshold due to dielectric loss characteristics of the "low-loss" dielectric material used to provide their respective immediately adjacent second dielectric layer zones.

Thus, systems and methods have been described that provide a prepreg layer/horizontal dielectric plane in a circuit board with different prepreg layer zones having different dielectric characteristics such that differential traces that require their immediately adjacent dielectric layers to have relatively lower loss dielectric characteristics may be provided immediately adjacent prepreg layer zones with relatively lower loss dielectric characteristics, and differential traces that do not require their immediately adjacent dielectric layers to have relatively lower loss dielectric characteristics may be provided immediately adjacent prepreg layer zones with relatively higher loss dielectric characteristics. For example, the zoned dielectric loss circuit board system of the present disclosure may include a board. A first differential trace is included in the board. A prepreg layer is included the board and that includes a first prepreg layer zone that engages the first differential trace and that includes first dielectric loss characteristics, and a second prepreg layer zone that is located immediately adjacent the first prepreg layer zone and that includes second dielectric loss characteristics that are greater than the first dielectric loss characteristics. A second differential trace may be included in the board in engagement with the second prepreg layer zone and may have a second trace length that is shorter than a first trace length of the first differential trace. As such, lower cost boards may be provided via the use of relatively lower costs prepreg materials without suffering negative effects on signal integrity.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A zoned dielectric loss circuit board system, comprising:
   a board;
   a first differential trace that is included in the board; and
   a prepreg layer that is included in the board and that includes:
      a first dielectric layer zone that engages the first differential trace and that includes first dielectric loss characteristics; and
      a second dielectric layer zone that is located immediately adjacent the first dielectric layer zone and that includes second dielectric loss characteristics that are greater than the first dielectric loss characteristics.

2. The system of claim 1, wherein the first dielectric loss characteristics include a first dielectric constant and first dissipation factor, and wherein the second dielectric loss characteristics include a second dielectric constant that is greater than the first dielectric constant, and a second dissipation factor that is greater than the first dissipation factor.

3. The system of claim 1, further comprising:
   a second differential trace that is included in the board, wherein the second dielectric layer zone engages the second differential trace.

4. The system of claim 3, wherein the first differential trace includes a first trace length, and wherein the second differential trace includes a second trace length that is less than the first trace length.

5. The system of claim 1, wherein the first differential trace is a stripline trace.

6. The system of claim 1, wherein the first differential trace is a microstrip trace.

7. An Information Handling System (IHS), comprising:
   a circuit board;
   a processing system that is mounted to the circuit board;
   a first differential trace that is included in the circuit board and that extends from the processing system; and
   a prepeg layer that is included in the circuit board and that includes:
      a first dielectric layer zone that engages the first differential trace and that includes first dielectric loss characteristics; and
      a second dielectric layer zone that is located immediately adjacent the first dielectric layer zone and that includes second dielectric loss characteristics that are greater than the first dielectric loss characteristics.

8. The IHS of claim 7, wherein the first dielectric loss characteristics include a first dielectric constant and first dissipation factor, and wherein the second dielectric loss characteristics include a second dielectric constant that is greater than the first electric constant, and a second dissipation factor that is greater than the first dissipation factor.

9. The IHS of claim 7, further comprising:
   a second differential trace that is included in the circuit board and that extends from the processing system, wherein the second dielectric layer zone engages the second differential trace.

10. The IHS of claim 9, wherein the first differential trace includes a first trace length, and wherein the second differential trace includes a second trace length that is less than the first trace length.

11. The IHS of claim 7, wherein the first differential trace is a stripline trace.

12. The IHS of claim 7, wherein the first differential trace is a microstrip trace.

13. The IHS of claim 7, further comprising:
   a connector that is mounted to the circuit board and coupled to the processing system via the first differential trace.

14. A method transmitting signals in a zoned dielectric loss circuit board, comprising:
   receiving, by a first differential trace that is located in a circuit board and that engages a first dielectric layer zone that is included in a prepeg layer in the circuit board, a first signal;
   transmitting, by the first differential trace, the first signal, wherein first signal losses associated with the transmission of the first signal by the first differential trace are below a signal loss threshold due to first dielectric loss characteristics of the first dielectric layer zone;
   receiving, by a second differential trace that is located in the circuit board and that engages a second dielectric layer zone that is included in the prepeg layer in the circuit board, a second signal; and
   transmitting, by the second differential trace, the second signal, wherein second signal losses associated with the transmission of the second signal by the second differential trace are below the signal loss threshold due to second dielectric loss characteristics of the second dielectric layer zone that are different than the first dielectric loss characteristics.

15. The method of claim 14, first dielectric loss characteristics include a first dielectric constant and first dissipation factor, and wherein the second dielectric loss characteristics include a second dielectric constant that is greater than the first electric constant, and a second dissipation factor that is greater than the first dissipation factor.

16. The method of claim 14, wherein the first differential trace includes a first trace length, and wherein the second differential trace includes a second trace length that is less than the first trace length.

17. The method of claim 16, wherein the second dielectric loss characteristics are greater than the first dielectric loss characteristics.

18. The method of claim 14, wherein the first differential trace and the second trace are stripline traces.

19. The method of claim 14, wherein the first differential trace and the second trace are microstrip traces.

20. The method of claim 14, further comprising:
generating, by a processing system that is mounted to the circuit board, the first signal and the second signal;
transmitting, by the processing system, the first signal to the first differential trace; and
transmitting, by the processing system, the second signal to the second differential trace.

\* \* \* \* \*

UNITED STATES PATENT AND TRADEMARK OFFICE
CERTIFICATE OF CORRECTION

PATENT NO. : 11,672,077 B2
APPLICATION NO. : 17/158524
DATED : June 6, 2023
INVENTOR(S) : Umesh Chandra It is certified that error appears in the above-identified patent and that said Letters Patent is hereby corrected as shown below:

In the Claims

Claim 7, Column 20, Line 18, "a prepeg layer" should read --a prepreg layer--
Claim 8, Column 20, Line 32, "the first electric constant" should read --the first dielectric constant--
Claim 14, Column 20, Line 55, "a prepeg layer" should read --a prepreg layer--
Claim 14, Column 20, Line 64, "the prepeg layer" should read --the prepreg layer--
Claim 15, Column 21, Line 6, "The method of claim 14, first dielectric loss" should read --The method of claim 14, wherein the first dielectric loss--
Claim 15, Column 21, Line 10, "the first electric constant" should read --the first dielectric constant--

Signed and Sealed this
Twenty-second Day of August, 2023

Katherine Kelly Vidal
*Director of the United States Patent and Trademark Office*